United States Patent [19]

Ward et al.

[11] 4,119,948
[45] Oct. 10, 1978

[54] REMOTE METER READING SYSTEM

[76] Inventors: Ernest Michael Ward, 6308 Jebel Way; Steven M. Ward, 325 Bright Water; Michael A. Dils, 329 Bright Water, all of El Paso, Tex. 79912

[21] Appl. No.: 681,502

[22] Filed: Apr. 29, 1976

[51] Int. Cl.$^2$ .................. H04B 9/00; H04Q 9/14; G08C 19/36
[52] U.S. Cl. ................... 340/151; 250/199; 340/189 R; 340/203; 340/310 A
[58] Field of Search ............... 340/151–152, 340/152 R, 152 T, 180, 189, 190, 203, 163, 310 A; 250/199

[56] References Cited
U.S. PATENT DOCUMENTS

| | | | |
|---|---|---|---|
| 3,227,882 | 1/1966 | Bissett et al. | 250/190 |
| 3,503,061 | 3/1970 | Bray et al. | 340/151 X |
| 3,513,443 | 5/1970 | Andersen | 340/163 X |
| 3,597,684 | 8/1971 | Damen | 340/189 X |
| 3,619,612 | 11/1971 | Belke | 340/190 X |
| 3,705,986 | 12/1972 | Sanders et al. | 250/199 |
| 3,727,185 | 4/1973 | Jones et al. | 250/199 |
| 3,820,073 | 6/1974 | Vercellotti et al. | 340/151 |
| 3,900,842 | 8/1975 | Calabro et al. | 340/310 A |
| 3,924,251 | 12/1975 | Crask | 340/190 |
| 3,928,760 | 12/1975 | Isoda | 250/199 |
| 3,937,880 | 2/1976 | Schlenrer | 340/189 X |
| 3,943,357 | 3/1976 | Culver | 250/199 |
| 3,971,930 | 7/1976 | Fitzmaurice et al. | 250/199 |

*Primary Examiner*—Donald J. Yusko

[57] ABSTRACT

An electro-optical remote meter reading system, including an electro-optical monitor unit having a non-contact meter scanner providing meter data to a digital storage and readout unit, and an electro-optical transponder effective to receive and to transfer data from the latter unit and to convert such data into a train of laser radiation pulses which are emitted in response to interrogation by a laser radiation pulse from a remote mobile interrogator unit which triggers the non-coded interrogation of the transponder. The interrogator includes a laser receiver and a pulse converting sub-system and is associated with further digital data processing equipment. A variant of the reading system interacts with a plurality of meters in a common location and provides sequential interrogation of a common, i.e., single, transponder, associated with the plurality of meters.

51 Claims, 9 Drawing Figures

FIG. 5A  METER SCANNER 24

FIG. 5B  METER SCANNER 24

FIG. 6 MONITOR UNIT TIMING DIAGRAM

REMOTE METER READING SYSTEM

BACKGROUND OF THE INVENTION

1. Field of the Invention

The invention relates generally to a remote meter reading system in which data derived from a meter is interrogated by and transmitted to a remote station, such as a mobile unit, and is further processed.

2. Description of the Prior Art

Considerable efforts have been made in recent years to increase the efficiency of reading consumption meters of the type that are standard equipment of and usually furnished by utility companies. Basically, the manual system has remained unaltered ever since these meters first came into common use. Previous efforts to eliminate or substantially reduce the high labor input for reading meters have been devoted to systems in which the meters are interrogated from a remote station with signals being transmitted via utility power lines, telephone lines or radio transmitters. Each such system, however, has serious disadvantages, raises unresolved technical complexities or is cost prohibitive. One such effort relates to transmitting the information via existing power transmission lines. The "line" system precludes, however, direct communication between the interrogating station and the meter inasmuch as the signals cannot be simply passed through the transformers scattered throughout the path of the transmission lines. In order to overcome signal interference by transformers, various signal by-passes, as well as through-passes, have been suggested.

Included in such approaches have been hybrid systems as exemplified by U.S. Pat. No. 3,656,112, in which a wireless link is employed to transmit the signals from one side of the transformer to the other side. It would appear, however, that no practical and/or commercially satisfactory solution has as yet been found. As noted in U.S. Pat. No. 3,900,842, the transmission by-pass approach, or radio transmission of signals from and to a control station, results in systems that are not only complex and cost prohibitive but even more importantly, are not dependable. The last mentioned patent proposed to overcome these difficulties by modifying the signals before and after they are transmitted through the transformer.

Other technical considerations and disadvantages germane to the use of power line data transmission includes the need to filter out or eliminate interferences from high amplitude noises generated by common electric gear and equipment.

While the use of radio frequencies (RF) as a transmitting medium would appear, at first glance, to have considerable merit, it has been found, upon more detailed consideration, that present systems are not acceptable for widespread applications for a variety of reasons. The RF transmission is basically omnidirectional and in order to enhance its directional characteristics large scale antennas and inordinately expensive microwave equipment has to be employed. But even the use of such equipment does not, however, completely eliminate or sufficiently diminish the difficulty of accurately pointing such devices in the direction of the meter location.

While heavy expenditures can be reduced by the use of lower frequencies, but still in the RF range, such use, however, will require coded interrogation and encounter interference from high voltage power lines, adverse weather conditions and radiation from numerous other sources. The unregulated and regulated band of RF is presently saturated with commercial and private users which constitute additional sources of interferences.

The use of telephone lines for transmission of data, as suggested for instance in U.S. Pat. No. 3,609,727, also raises numerous technical as well as non-technical obstacles. It is immediately apparent that such a system requires not only the existence of a telephone proximate to the meter to be monitored, but also the availability and/or cooperation of the telephone user when the monitoring is to take place. The resulting tone pulses transmitted over telephone wires are subject to interferences from cross-talk, power line radiation, simultaneous line traffic, variable line attenuation and similar conventional occurrences, which may alter or destroy the meter data. Aside from this aspect, on which opinions vary, phone tariff considerations have impeded or restrained the acceptance of the system.

Many of the prior art systems require for proper meter monitoring a significant modification or replacement of present day meters. It is estimated that several hundred million utility consumption meters are installed in this country. Hence any system that will require substantial alteration of the meter will have significant economic ramifications which may defeat or detrimentally affect the acceptance of the system. A typical approach for modifying a meter for use in a remote meter reading system is shown in U.S. Pat. No. 3,566,384.

SUMMARY OF THE INVENTION

It is therefore the primary object of the present invention to provide a laser oriented, electro-optical remote meter reading system, which overcomes the numerous disadvantages, shortcomings and difficulties of the prior art systems and which is very significantly cost advantageous.

It is a more specific object of the present invention to provide a remote meter reading system to facilitate the periodic inspection of the meters from a mobile station, such as a van, airborne vehicle, or by a person with handheld equipment, to significantly speed up the meter reading process while at the same time appreciably reducing the operating expenses for collecting the meter data.

It is a further object of the present invention to provide a remote meter reading system which interrogates the meter and obtains reply data by electro-optical light radiation whereby the problems encountered in power line transmission, such as bypasses or special arrangements for signal throughput around or through transformers is completely eliminated.

It is a still further object of the present invention to provide a remote meter reading system of the type described in the preceding paragraphs, in which the need for coded interrogation required for selecting individual meters is eliminated. The system in accordance with the present invention permits single pulse, non-coded interrogation of either one or a large group of meters.

It is a still further object of the present invention to provide a remote meter reading system utilizing a single transponder for a meter which is to be monitored, or a single transponder for a plurality of co-located meters with stacked memories.

It is a further object of the present invention to provide a remote meter reading system in which utility power lines are unaffected by the operation of the system, and the need to alter the construction of conventional utility meters is completely eliminated requiring merely that an electro-optical monitoring device be installed in proximity to the meter. The system thus eliminates the numerous technical and economic problems which have greatly contributed to the failure of acceptance of prior art devices. More specifically, the present invention can be manufactured and installed at low cost, and a high signal-to-noise ratio can be attained due to narrow bandwidth transmission and optical filtering.

It is a still further object of the present invention to provide a system of the type described above, in which the need for complex circuitry affecting carrier modulation of binary-data is obviated by means of a direct digital activation of a laser diode transmitter.

It is a still further object of the present invention to provide an electro-optical remote meter reading system which results in non-contact reading of the meters and without any electrical or mechanical interference thereof that could cause meter wear, or in any way contribute to any potential malfunctioning of the meters. Moreover, the system yields, when scanning the meter, a high signal-to-noise ratio with respect to the full meter wheel cycle rotation detection pulse and a very reliable method for detecting meter wheel revolutions.

It is a more specific object of the present invention to provide a system in which the interrogation, i.e., challenge of an interrogator and data reply therefrom, are transmitted by coherent radiation sources in the infrared spectrum facilitating optical filtering and, therefore, avoiding ambient interferences which have detrimentally affected systems of the prior art.

It is a still further object of the present invention to provide a system of the type described above in which interrogation and data transmission by coherent radiation facilitates an accurate control of beam width and beam direction avoiding any requirement for coded interrogation which is necessary for omnidirectional RF systems and further eliminates common errors inherent in semidirectional microwave RF systems due to replies from unintentionally interrogated meters.

It is a still further object of the present invention to provide a system wherein the beam pattern of the transmitter data is shaped and diverged in a predetermined manner to accommodate the location of the meter monitor unit such that the data receiver of the mobile unit is in the beam cross-section for a few seconds or less, while the mobile unit passes the proximity of the transponder of the meter monitor unit. This facilitates multiple readings of the meter data which contributes to a high accuracy of data reception.

It is also to be briefly noted that the present invention is based upon data communication by coherent laser radiation traversing unobstructed pathways. Such system utilizes very low power laser diodes providing a broad, diverging beam at extremely low radiation power density levels. The magnitude of these levels is such that hazards common to high power lasers are totally avoided. Even intra-beam viewing at very close range of the output optics has no adverse affect to eyesight. In this context reference may be had to "Control of Health Hazards from Lasers and Other High Intensity Optical Sources", published Mar. 15, 1974, Department of the United States Army, Regulation 40-46, Laser Safety Standards.

While the present invention obviates the need for coded interrogation such use is not technically incompatible therewith. However, interrogation by discriminating optical scanning by means of directing an optically shaped laser beam towards the monitor unit incorporates a number of advantages and simplifications. Moreover, the shape of the optically oriented laser beam emanating from a laser diode or an array of laser diodes can be chosen to satisfy the need for different beam divergences to accommodate the widely varying geometrics of the locations for the monitor unit. The coherent, shaped beam radiation enables precise selectivity for monitor interrogation at a very rapid pace. Thus, in a typical single home neighborhood, a beam, hypothetically, at 50 feet from the van, may have a horizontal beam width of less than two feet and a vertical beam width of nearly twenty feet. As the system has the capability to radiate at e.g., 1000 pulses a second, it will be appreciated that automatic scanning — i.e., without a single operator (disregarding the driver of the van) can be accomplished in a very short period of time.

The optical system of the meter monitor unit is suitably selected to provide the required beam pattern to be effective at a given distance to properly interact with the interrogator.

The remote electro-optic monitor system of the present invention incorporates optics and analog and digital electronics to monitor the status of a metering device, convert that status into digital information, store the status information, upon interrogation radiate a binary representation to a desired location, receive that information back into digital form and store that information for direct computer processing.

For simplifying the general description, the system is herein divided into two major subsystems. One subsystem is referred to as the monitor unit and entails all the components to be located at or near the metering device being monitored. The other subsystem is referred to as the remote interrogation and receiver unit and comprises all the components to be located at a desired remote location.

As a variant of the subsystem there will also be described a multiple memory monitor unit, which allows several meters grouped in one location to utilize a single transponder for interrogation reception and data transmission.

In order to facilitate the description of the monitor unit, the application of monitoring a typical electric power meter will be considered. In this type of meter the mechanical representation of power consumed is converted into a signal which can be readily transmitted. While the system of the present invention is particularly advantageous and unique for reading common power meters, its application is not restricted thereto. Hence the term "meter" is used also in a sense to encompass other status indicators for a variety of industrial applications. The term "transponder", of the monitor unit, as used herein, denotes a "transmitter — receiver" capable of accepting the challenge of an interrogator and automatically transmitting an appropriate reply. The term "interrogator", of the interrogation and receiver unit, as used herein, denotes a "transmitter — receiver" which triggers the transponder and receives the reply.

Although the present invention is described primarily with respect to the preferred embodiment, an optional implementation is feasible in a system wherein the component operating lifetime is considered to be irrelevant.

This modified system allows the monitor unit to radiate updated meter information continuously, obviating the interrogation function. In this mode, the mobile unit interrogator is replaced with a strict receiver and the monitor unit transponder is replaced with a strict transmitter. In this mode, coherent laser beam control allows the mobile unit to pass through the individual and non-overlapping data radiation fields collecting the required meter information. For the application of reading consumer utility meters, however, this mode does not effect an efficient utilization of component operating lifetimes.

Optionally, in the case of reading utility consumption meters, the system permits the arrangement of a small computer and card printer within the mobile van to facilitate the immediate distribution of the resultant bill to the customer.

It is therefore an aspect of the present invention to provide an electro-optic remote utility meter reading system which comprises a first arrangement generating a plurality of signals with each signal representing a predetermined quantity of the utility measured and with the number of signals generated being quantitatively in direct proportion to the utility measured by the meter. A second arrangement is associated with the first arrangement and is adapted to convert the aforesaid signals into digital pulses. A third arrangement provided with a memory receives and stores these digital pulses. A fourth arrangement includes an electro-optical transponder which is effective in response to interrogation by laser radiation pulses to cause the third arrangement to transfer pulses from the third arrangement to the fourth arrangement and to emit these pulses in the form of laser radiation. A fifth arrangement includes an interrogator at a location which is remote from that of the transponder to trigger the interrogation and to receive the pulses from the transponder. Finally, the system includes a sixth arrangement which receives signals from the interrogator for selectively providing intelligence reflecting the measured quantities.

Another aspect of the present invention resides in providing an electro-optic remote meter reading system in which the meter or status indicator has a mechanical representation. The system includes a monitor unit having electro-optic light radiation monitoring a digital storage capability and being effective to electro-optically detect a change in the mechanical representation and to translate such change into electronic digital pulses and to store the digital pulses. The monitor unit further includes an electro-optic transponder arrangement for receiving the digital pulses from the storage unit, converting the digital pulses into light radiation, and for transmitting the radiation; the radiation being a carrier for a train of pulses. The system further includes a remote electro-optic interrogator arrangement located at a point spaced from the monitor unit and effective to electro-optically trigger the transponder and to receive the train of pulses from this transponder.

A still further aspect of the present invention resides in providing an electro-optic remote meter reading system which includes a meter monitoring arrangement having a transponder responsive to light radiation and being effective upon interrogation thereof to transmit data in the form of light radiation pulses. The system further includes a remote interrogation and receiver arrangement having an interrogator to trigger electro-optically, with light radiation, the aforesaid interrogation and to receive the data.

A still further aspect of the present invention resides in providing an electro-optic scanner for a utility meter in which the meter has a movable mechanical representation which moves at a predetermined rate which is proportional to a rate of meter throughput. The scanner includes a light emitting source and a cooperating light detector to provide continuous reflective scanning derived from the movement of the mechanical representation and includes an arrangement effective to generate electro-optic signals whose cumulative number has a predetermined correlation to the aforesaid mechanical representation.

A still further aspect of the present invention resides in providing an electro-optic remote utility meter reading system of the type delineated in the first aspect statement of the invention. This system, however, is in combination with a plurality of meters located in close physical proximity. Each individual meter is associated with one of the aforementioned first, second and third arrangements referred to in the first aspect of the invention statement and further includes a fourth arrangement, which constitutes a single unit which is associated with all of the plurality of meters and is effective to provide sequential interrogation and data pulse radiation.

A still further aspect of the present invention resides in providing an electro-optic remote utility meter reading system which includes a first arrangement for generating a plurality of signals with each signal representing a predetermined quantity of the utility to be measured and with the number of signals generated being quantitatively in direct proportion to the utility measured by the meter. A second arrangement, which is associated with the first arrangement, and is adapted to convert the aforementioned signals into digital pulses. A third arrangement which is provided with a memory to receive and store these digital pulses. A fourth arrangement which includes an electro-optic transponder which continuously emits laser radiation pulses to cause the aforementioned third arrangement to transfer pulses from the third arrangement to the fourth arrangement, and to emit these pulses in the form of laser radiation. A fifth arrangement which includes a receiver at a location remote from the transmitter to receive the radiation and, finally, a sixth arrangement which is constructed and arranged to accept signals from the receiver for selectively providing intelligence reflecting the measured quantities.

A still further aspect of the present invention resides in providing a carryable electro-optic interrogator for cooperating with an electro-optic transponder which is associated with a utility meter. The device includes an electro-optic interrogator arrangement which is effective to electro-optically trigger the aforementioned transponder and in response thereto receive a train of light radiation pulses.

For a better understanding of the present invention, together with other and further objects thereof, reference is had to the following description taken in connection with the accompanying drawings, and its scope will be pointed out in the appended claims.

Figure 1:
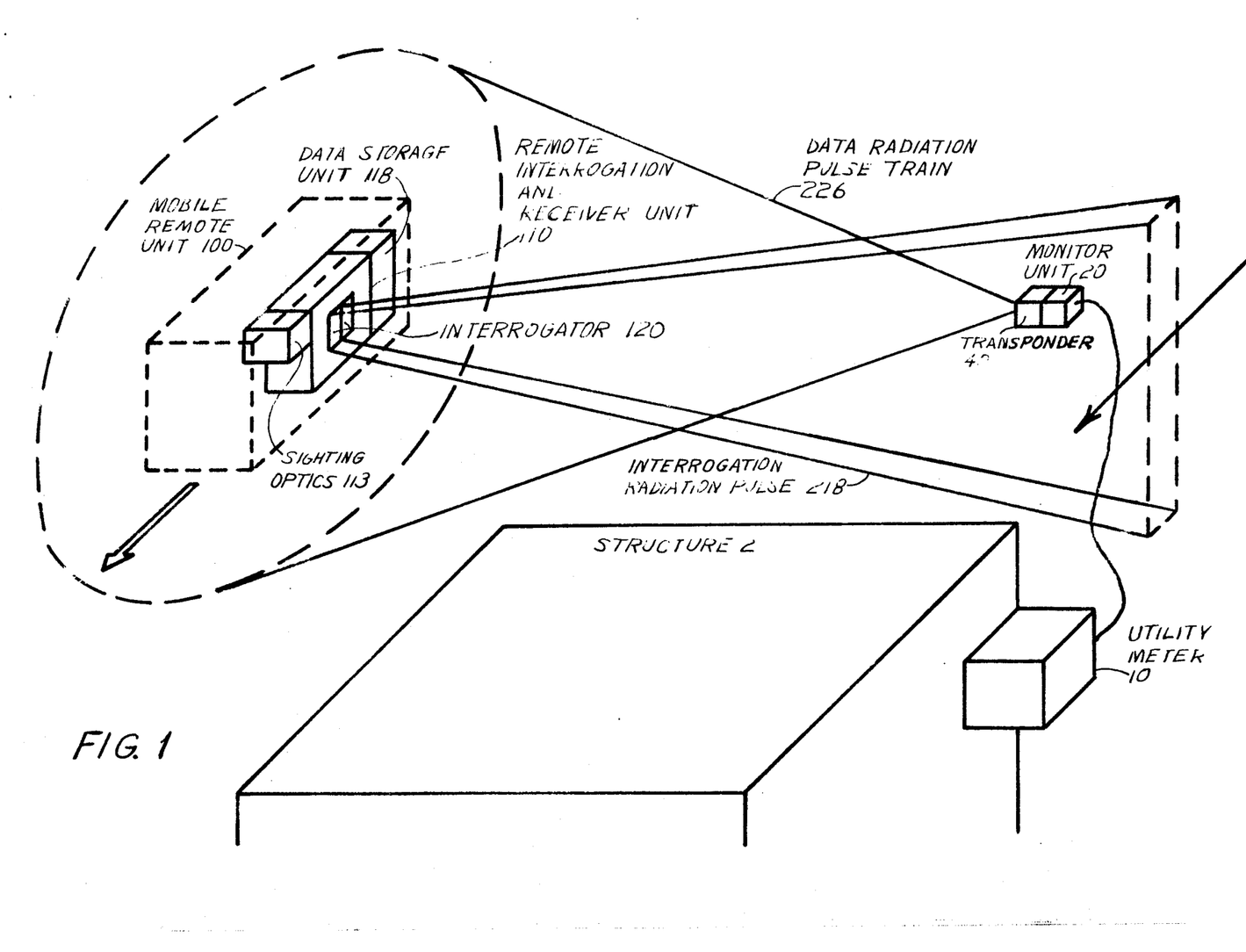
FIG. 1 is generally an overall schematic block diagram illustrating a mobile unit, a fixed meter monitor unit with a three dimensional illustration of radiation beams therebetween.
Figure 2:
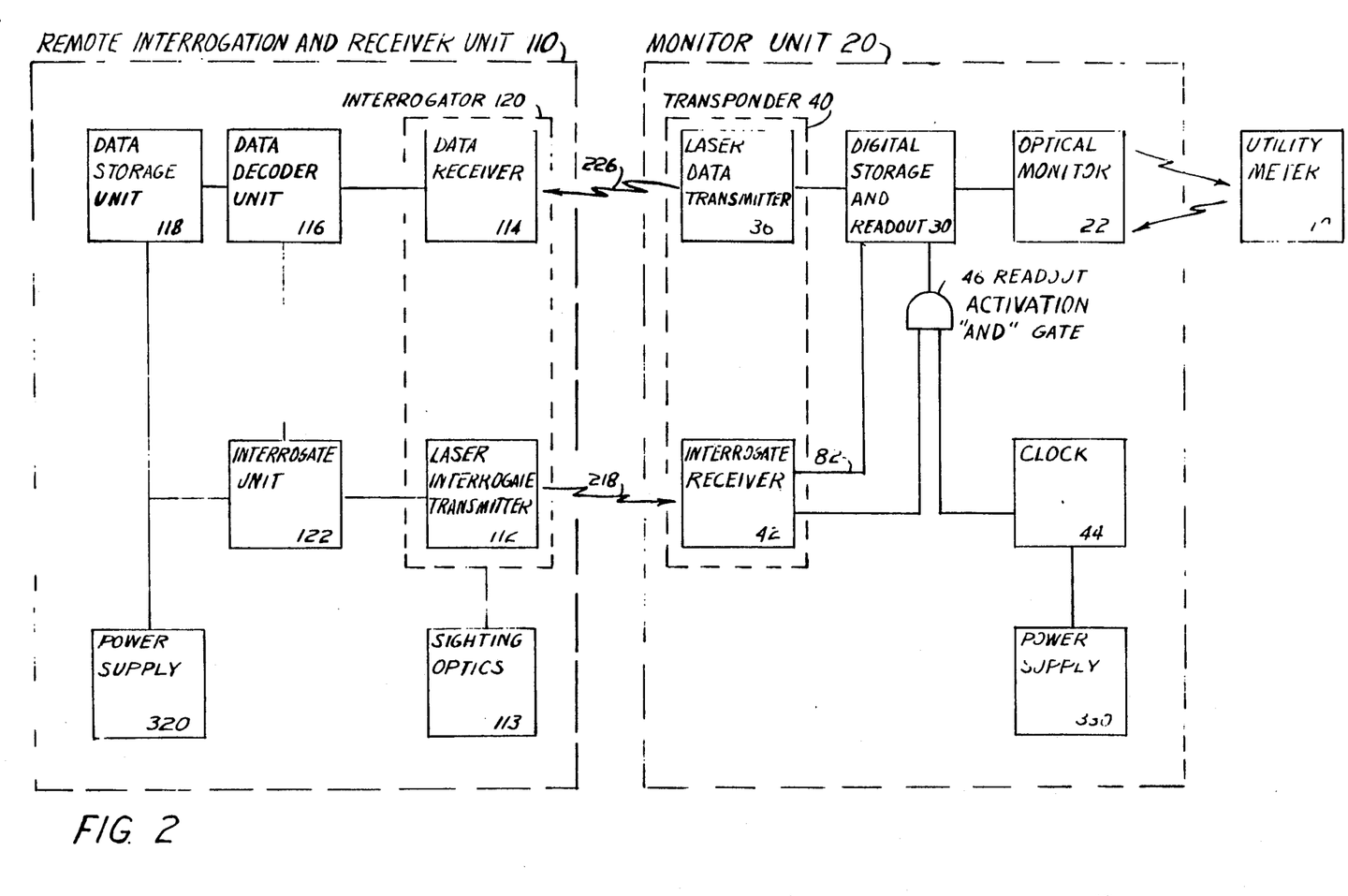
FIG. 2 is a block diagram of the two main subsystems, i.e., the monitor unit and the remote interrogation and receiver unit.

Referring now to the drawings there is shown in FIGS. 1 and 2 a schematic arrangement of a remote meter reading system in accordance with the present invention which includes a utility meter 10 and a monitor unit 20 provided with a transponder 40. The monitor unit 20 is adapted to electro-optically scan the meter 10 and is in part located external to a structure 2 where the flow of (e.g.) energy, fuel, fluid, material, etc., is to be metered or measured (hereinafter simply referred to as utility meter reading system, or the like).

In a typical mode of operating the present invention, a mobile unit 100, such as a van, an airborne vehicle, or a hand-held unit, is equipped with a remote interrogation and receiver unit 110 (for simplicity hereafter referred to as RIRU 110) having an interrogator 120 adapted to communicate with the transponder 40 of the monitor unit 20 by means of infrared light radiation pulses 218 to challenge, i.e., interrogate, the monitor unit 20 and to obtain meter data which is stored in data storage unit 118.

As will be apparent from the FIG. 1, the pulse radiation emitted from transponder 40 has a significantly greater beam angle than the cooperating radiation beam emanating from interrogator 120.

The Remote Interrogation and Receiver subsystem (RIRU) 110 has both an interrogation and receiver function. This subsystem is located in a mobile unit 100. The function of this subsystem is to activate the monitor unit by laser interrogation, to receive data transmitted by laser radiation pulses 226 emitting from the monitor unit, and to adapt the radiation pulses for digital processing.

The interrogation station interrogates each such meter or a plurality of meters, from (e.g.) a street location, and in response to such trigger automatically receives the meter reading, an account index number and a meter status indicator. The meter reply information is absorbed in the unit and recorded in digital form on magnetic tapes facilitating a direct input into a customer billing computer.

When numerous meters are grouped together, such as is common in large apartment complexes, a multiple memory monitor unit receives data from the various meters, including the different identification codes. The multi-unit memory utilizes a single transponder for interrogation and data transmission.

The time required to read the meter with the system of the present invention is approximately from 0.01 to 1.0 seconds (depending on clock rates) and the time required to travel from one inspection point to another which in an average U.S. urban neighborhood of single homes is from 3 to 10 seconds (assuming a mobile vehicle moving at 25 mph). If the mobile unit is equipped with dual interrogators, both sides of the street can be interrogated and data obtained with one pass, reducing the hypothetical effective travel time to 1.5 to 5 seconds. The resulting time reduction factors for direct electro-optical meter reading over the conventional approach has been estimated to range from approximately 14 to 1 to 45 to 1 depending on the geometry of the neighborhood.

As is shown in FIG. 2, the monitor unit 20 comprises a plurality of elements which are either electrically or electro-optically associated with each other as subsequently further described in detail. The monitor unit includes an optical monitor 22 located adjacent to meter 10 for scanning the meter 10 and for converting light radiation signals corresponding to quantities of utility measured to digital signals and transmitting these signals to a digital storage and readout unit 30 which is effective to pass the information, to a laser data transmitter 36 of transponder 40 in response to activation by interrogate receiver 42 operating in association with clock 44 and readout activation "AND" gate 46. All components of this subsystem are provided DC power from a single power supply 330, utilizing, for instance, house current.

The interrogate receiver 42 is in turn actuated by laser interrogate transmitter 112 of RIRU 110 of mobile unit 100. The transmission of laser radiation from transmitter 36 is received by data receiver 114 of interrogator 120 which signals are suitably converted in data decoder unit 116 and passed on to data storage unit 118. The interrogation unit 122 activates the transmitter 112 to trigger the metering operation. All components of this subsystem are provided DC power from a suitable power supply 320.

MONITOR UNIT

Figure 3:
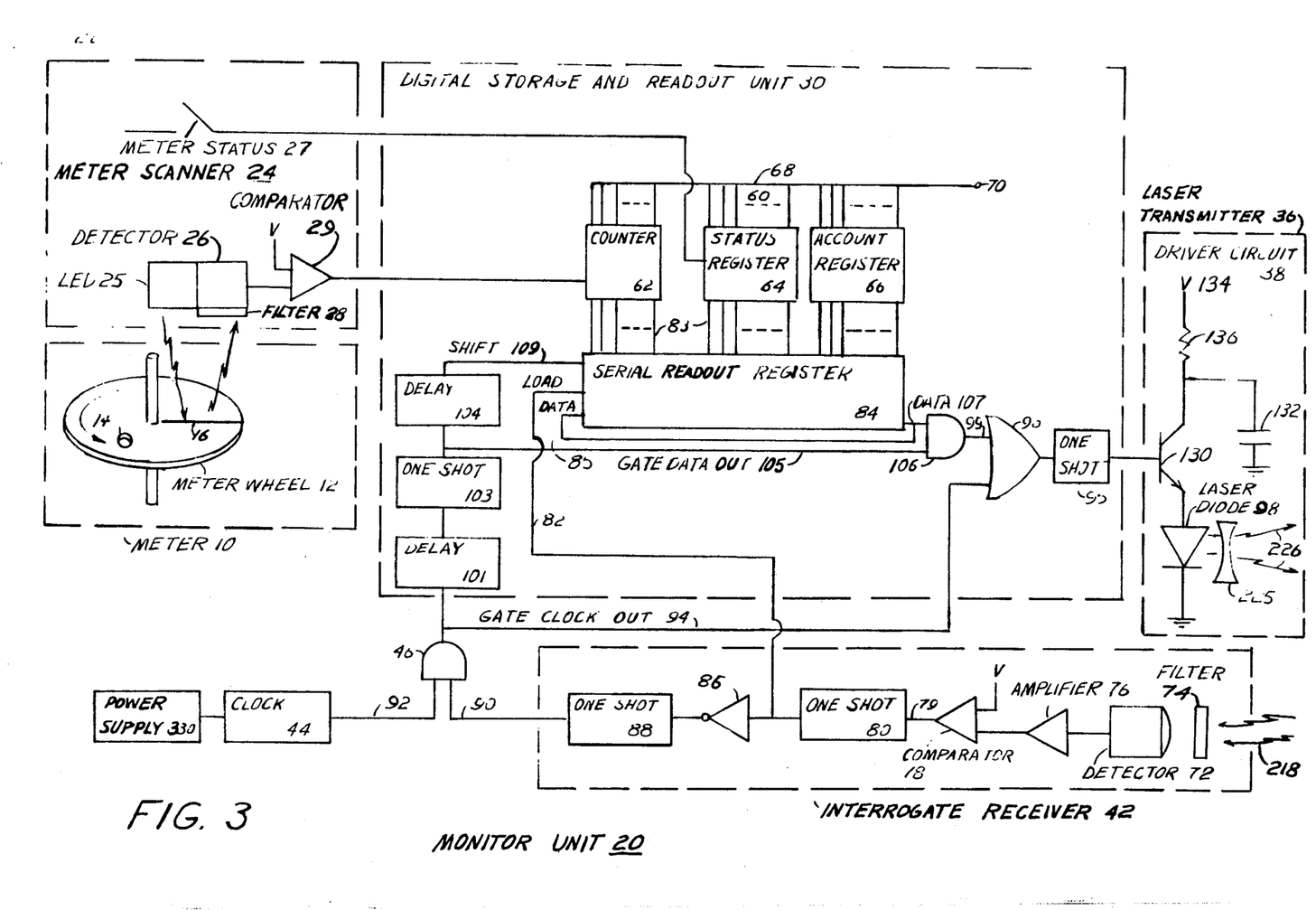
FIG. 3 is a more detailed block diagram of the subsections of the monitor unit.

The monitor unit 20 is hereafter described in greater detail and reference is made to FIG. 3. All analog and digital circuitry and electro-optic devices in the monitor unit require direct current power. The power is derived from a single power supply unit 330 which converts 60Hz alternating current, power line voltage, into the required direct current voltages. A full wave rectified, 120Hz waveform available in the power supply 330 is also used to activate the subsystem clock 44 at the same frequency.

Figure 5A:
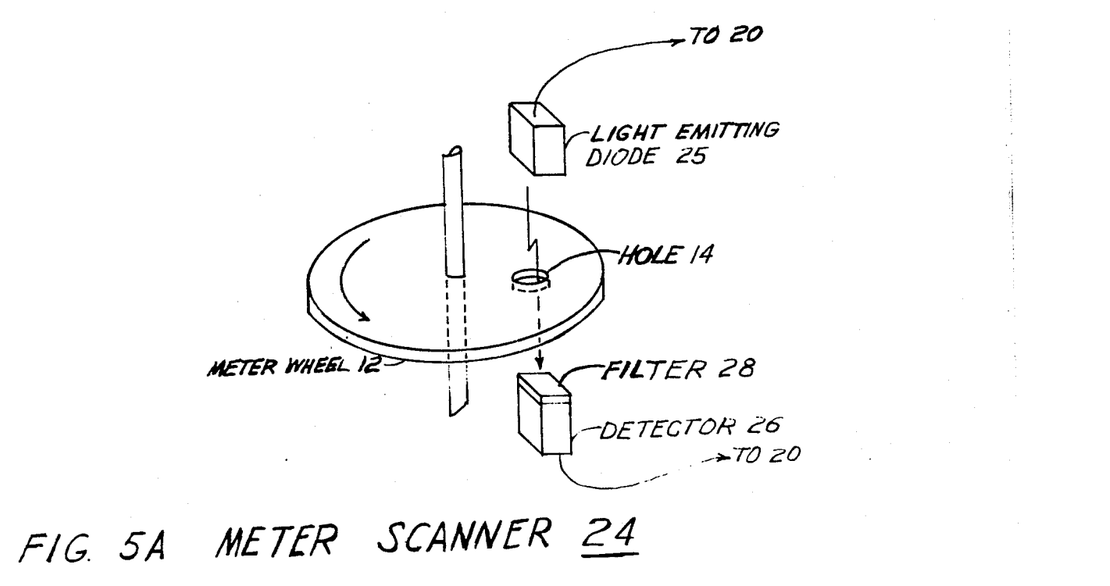
FIG. 5a is, generally, a schematic illustration of part of a utility meter and an electro-optical meter scanner.
Figure 5B:
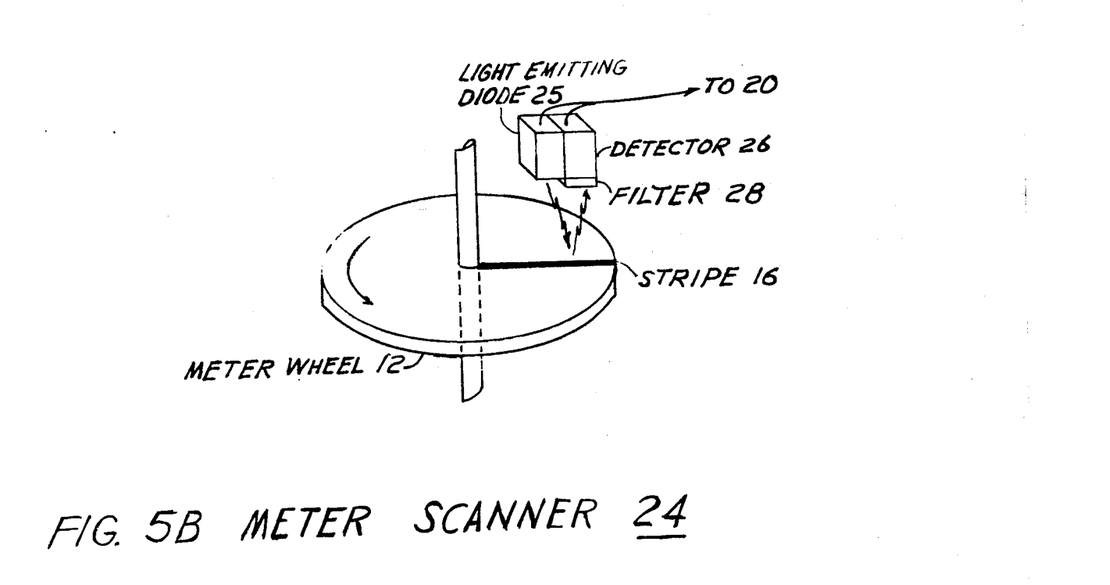
FIG. 5b is a view similar to FIG. 5a showing a modification thereof.

The optical monitor 22 of monitor unit 20 includes a meter scanner 24 having a suitably matched light emitting diode/photodiode detector pair 25,26, secured in proximity to a power meter calibration wheel 12 for detecting each full cycle of rotation of wheel 12, see also FIGS. 5a and 5b. The wheel 12 rotates at a rate which is in direct proportion to the flow of utility being monitored by the meter 10. The emitter (LED) 25 and detector 26 are placed in suitable juxtaposition on opposite sides of wheel 12, provided with an opening 14 thereby allowing the emitter 25 to directly illuminate the detector 26 cyclically for a short period of time, please see FIG. 5a. Alternatively, in the meter scanner 24', both the emitter and detector 25,26 are placed on the same side of the wheel 12, as shown in FIG. 5b. Herein, the emitter 25 continuously illuminates a portion of wheel 12 with a radially extending stripe 16, while the detector 26 detects and identifies the energy reflected from the stripe 16.

Regardless of the particular geometry utilized, the photodiode detector 26 yields a single analog pulse for each meter wheel full cycle of rotation. The radiation input from the LED 25 to the photodiode detector 26 is terms of changes of reflectivity or transmissivity is optically filtered by a narrow bandwidth filter 28 associated with the detector 26 to effect a matching of the output spectrum of the light emitting diode 25 and to block ambient light radiation. The bondwidth of the filter 28 is approximately 400Å and has a center frequency matching the wavelength transmitted by the LED 25 obtaining extremely high signal-to-noise ratio.

The radiation received by the photodiode detector 26 is transmitted to a comparator 29 which changes the low level analog pulse, at its input to a corresponding digital pulse at its output. When the analog pulse level in the comparator 29 exceeds a predetermined threshold value, the comparator 29 generates a corresponding digital pulse. The meter scanner 24 thus yields a digital pulse for each meter wheel revolution. The digital pulses are transmitted to the digital storage and readout unit 30 which accumulates a pulse count representing a measure of the flow of utility.

The digital storage and readout unit 30 includes a three part data memory 60 which stores the desired data concerning utility consumption, meter status and customer's account number in three memory registers 62, 64 and 66, respectively. All three registers 62, 64 and 66 have a set/read wiring 68 connected to an external test jack 70 such that the digital value stored in the registers can be directly read or set to a desired state via the test jack by a separate testing device, not shown. A meter status switch 27 representing any desired meter condition (e.g., meter cover removed, large magnet detected, etc.) is available for setting meter status register 64 at any time. The customer's account number is set into account register 66 and remains unchanged until a new account utilizes the meter 10 or some other identification is to be imparted to the meter. A typical memory capacity is 42 bits allowing 20 bits for the counter 62 (equivalent decimal count to 1,048,576), 2 bits for the meter status register 64 (two types status stored) and 20 bits for the account number register 66 (up to 1,048,576 different accounts). The meter memory capacity can be significantly altered based on meter inspection intervals. In the event of a power outage the data in memory is preserved either by providing a back-up power source, such as a rechargeable battery, or a solid state or magnetic nonvolatile memory which has the capability of storing and retaining the data during the outage, for instance see U.S. Pat. No. 3,820,073.

In its active mode, when transmission of the data to the RIRU unit 110 is to take place, the interrogate receiver 42 of monitor unit 20, first detects an interrogation signal from the laser interrogate transmitter 112 of RIRU 110. The interrogation signal from transmitter 112 is comprised of coherent, laser radiation 218 in the infrared spectrum and is received by a photodiode detector 72 through a narrow band pass filter 74, both forming part of interrogate receiver 42, the filter 74 having a bandwidth on the order of 100Å and a center frequency matching the wavelength of the interrogation device 112. The primary function of the filter 74 is to provide high attenuation to ambient radiation at wavelengths other than the laser wavelength resulting in a very high signal-to-noise ratio. Upon receipt of the interrogation laser radiation 218 from transmitter 112, the characteristic impedance of the photodiode 72 changes such that the incoming radiation pulse 218 causes adjacently connected amplifier 76 to provide an analog pulse output. The amplifier amplifies the analog signal to a higher level signal which is fed to an analog comparator 78. When the analog pulse level in the comparator 78 exceeds a predetermined threshold level, the comparator generates a corresponding digital pulse.

The leading edge of the digital pulse passes through a cable 79 and triggers a one shot monostable multivibrator 80. The one shot multivibrator 80 outputs a logic "one" voltage level of short duration (e.g., 1 microsecond). The resulting digital output generates a "load command" instructing via line 82 to serial readout register 84 of the digital storage and readout unit 30 to be set to binary states identical to those states stored in the memory registers 62, 64 and 66 via parallel connecting lines 83. After the parallel to parallel loading function is completed the serial readout register 84 contains the digital word to be transmitted.

The data fed to the memory register 62 is stored therein in cumulative form and is not reset to zero after an interrogation has taken place. Thus, the information readout periodically represents a value which includes the incremental value that has been added between interrogations. The difference of such a value, i.e., the added value, is ascertained and processed in a mode which is conventional in the industry to determine the quantity of utility measured for a given period.

The digital output of the one shot multivibrator 80 is then inverted by a digital inverter 86 such that a delay equal to the duration of the one shot multivibrator 80 output will be realized prior to triggering another one shot multivibrator 88 connected to and located past the inverter 86. The sequence of one shot multivibrator 88 is relatively long in duration (e.g., 1 second) such that the duration of the output logic "one" level passing through line 90 to gate 46 determines the period of time that the monitor unit 20 will be allowed to transmit data through the laser data transmitter 36.

The digital clock 44 provides continuous digital signal output at a desired clock rate which preferably is 120Hz. This rate is preferred since utilizing a full wave rectified signal in a standard power supply 330 to trigger a Schmidt trigger circuit, a very convenient 120Hz clock 44 is constructed. The clock 44 generates logic "one" level outputs which are transmitted continuously through connecting 92 to one input of a two input logic readout and activation "AND" gate 46. When the other input of gate 46 is raised to a logic "one" level for the duration of the logic "one" output of one shot multivibrator 88, the clock pulses transmitted, see line 92, are enabled to pass through "AND" gate 46. The output of the "AND" gate 46 (i.e., clock pulses) provides two functions. First, each clock pulse, see line 94, is passed through a logic "OR" gate 96 forming part of digital storage 30 and triggers a one shot multivibrator 95. The output of the latter one shot multivibrator is very short in duration, 200 nanoseconds in the preferred embodiment, and is used to fire the laser diode driver circuit 38 of the laser data transmitter 36.

Therefore, all clock pulses passing logic "AND" gate 46 result in a subsequent firing of the laser diode 98 in a manner that synchronizer pulses 226 are transmitted to the remote interrogation and receiver unit 110 by means of laser radiation.

Figure 6:
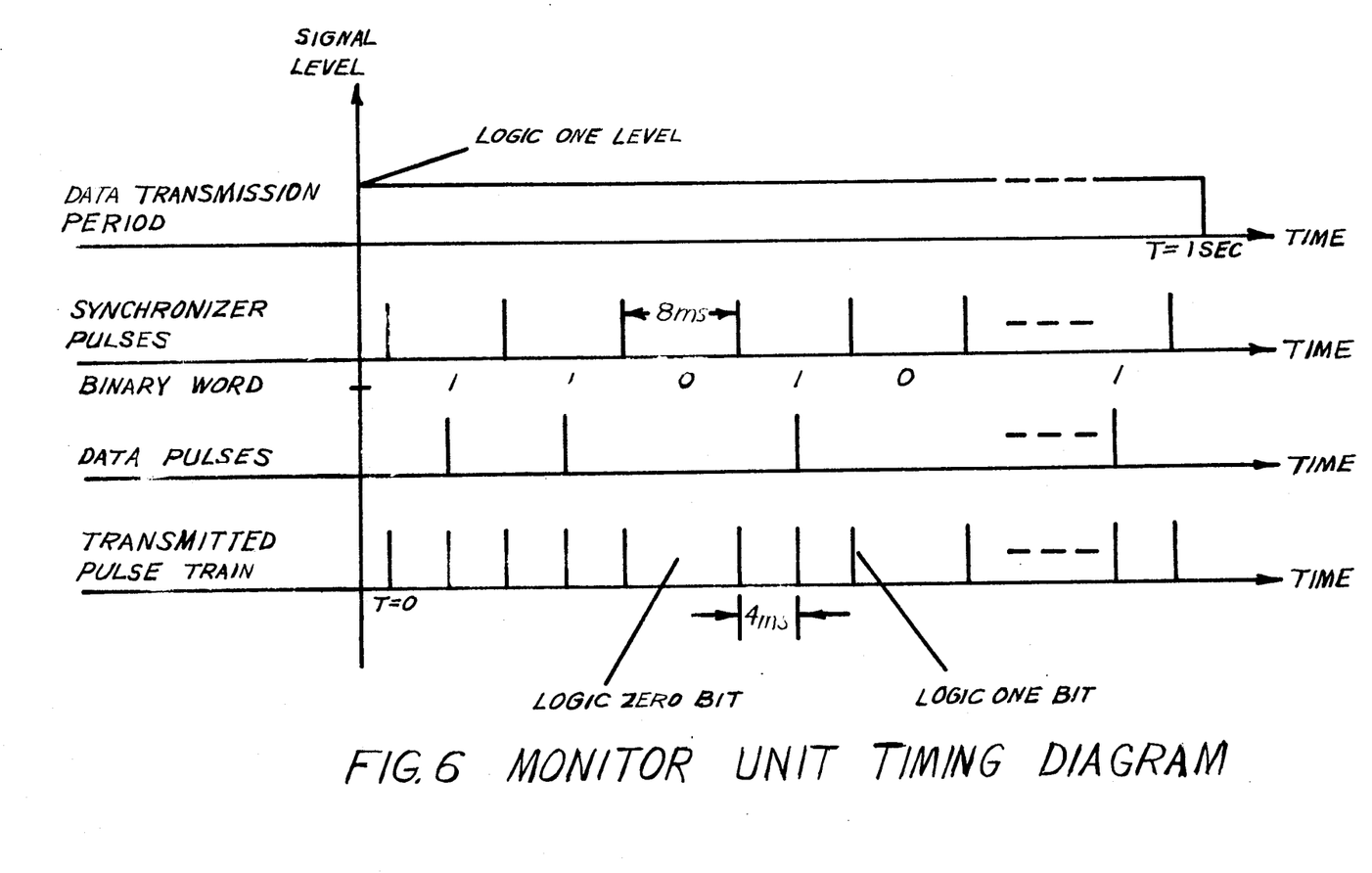
FIG. 6 is a schematic timing diagram for the monitor unit.

Clock pulses enabled by "AND" gate 46 are also utilized to shift data out of the serial readout register 84 such that data pulses along line 99 will also result in subsequent firings of the laser diode 98 providing laser transmission of desired data to the remote interrogation and receiver unit 110. In this function, the clock pulses are delayed by a delay multivibrator 101 by a period of time equal to one half the clock inter-pulse period, 4 milliseconds in the preferred embodiment (see FIG. 6). This delay multivibrator 101 provides equal spacing in time of synchronizer pulses to be transmitted and data pulses to be transmitted as seen in FIG. 6. After the clock pulse is delayed by the delay multivibrator 101, the clock pulse fires another one shot multivibrator 103 of short duration, 1 microsecond in the preferred embodiment. The logic "one" output transmitted through line 105 of this one shot multivibrator represents a "gate data out" command (i.e., a digital control signal) and is applied to one input of a two input logic "AND" gate 106. The serial data output 107 of the serial readout register 84 is applied to the other input of the logic "AND" gate. Therefore, if the first bit of the serial readout register 84 contains a logic "one" level this data bit is gated through the "AND" gate 106 in the form of a data bit with a duration equal to that of the output of one shot multivibrator 103. The data bit passes through the logic "OR" gate 96 activating the one shot multivibrator 95 resulting in a subsequent firing of the laser diode transmitter 36.

The resulting pulse of laser radiation, therefore, represents a logic "one" bit located in the first position of the digital word to be transmitted. On the other hand, if a logic "zero" level is located at the first position of the serial readout register 84 the logic "AND" gate is disabled and a logic "zero" data bit is transferred to the laser diode driver circuit 38. The resultant non-firing of the laser diode transmitter 98 at the proper time represents the transmission of a logic "zero" in the first position of the digital word to be transmitted.

The one shot multivibrator 103 generates a clock pulse output used to shift the digital word out of the serial readout register 84 so that the entire word can be read out in the previously described manner. The clock pulse outputs of one shot multivibrator 103 are delayed by a short period of time, 1 microsecond in the preferred embodiment, so that the first bit in the serial readout register 84 can be read out to the laser dioed driver circuit 38 prior to the entire digital word being shifted one place. This shifting occurs as a result of a "shift" command, as exemplified by line 109, applied to the serial readout register 84 from delay multivibrator 104.

The serial readout register 84 is a parallel load, serial output, ring counter type. In this standard type of register the serial output is tied directly back to the serial input by a ring connection 85. In this mode of operation the binary bits in the digital word originally loaded in parallel fashion are allowed to circulate through the serial readout register 84 as long as the register continues to receive shift commands 109. As previously stated, this period of time is controlled by the duration of the logic "one" output of one shot multivibrator 88.

One half clock interpulse period after each shift command occurs (see 109), each bit of the serial readout register 84 is given the opportunity to activate the laser diode 98 of transmitter 36. In this manner the entire digital word is repetitively read out to the transmitter 36 at the clock rate. Therefore, a continuous data train is mixed with a continuous synchronizer pulse train resulting in a train of laser diode fire commands as illustrated in FIG. 6 which occur at twice the clock rate for the duration of the data transmitting period controlled by one shot multivibrator 88. This mixture of data pulses and synchronizer pulses is presented to the laser diode driver circuit 38 as the output of one shot multivibrator 95. This technique of synchronizer pulse and data pulse transmission affords a very convenient means of data decoding at the RIRU 110.

Although many potential designs exist for the laser diode driver circuit 38, a very simple design in the preferred embodiment is shown in FIG. 3 and more specifically in the laser data transmitter portion 36 thereof. In this design, the transistor 130 operates as a "normally open" switch where a capacitor 132 is energized and in turn charged to a voltage Vc 134 through the resistor 136. When a short duration logic "one" level is placed on the base of the transistor 130, the effective switch closes for the duration of the logic "one" level applied in the preferred embodiment. The resultant switch closure allows the capacitor 132 to discharge through the low resistance laser diode 98. This discharge results in a very high level current pulse through laser diode 98 causing a very short burst of laser radiation to be transmitted as exemplified by reference numeral 226 by laser data transmitter 36.

The beam 226 of radiant energy from laser diode 98 is emitted through an optical lens 225 to form a beam of conical shape to provide a full angle beam divergence of about 60°. In an exemplary beam configuration for a hypothetical common application, the 60° divergence offers a cross-sectional diameter of 115 feet at a range of 100 feet extending from the monitor unit 20. The beam configuration allows the mobile remote unit 100 to sweep through the radiation field at a high rate of speed, as previously indicated, without compromising data exchange accuracy.

In view of the aforestated, as a typical data bit train illustrated in FIG. 6 is applied to the base of the transistor 130, the laster diode 98 yields a burst of laser radiation for each pulse received. The resulting laser radiation data train 226 therefore corresponds directly to the digital data train applied. This data train consists of synchronization pulses and data pulses transmitted to the remote interrogation and receiver unit 110 to facilitate reconstruction of the digital word originally stored in the serial readout register 84. The word is transmitted a plurality of times to facilitate word comparisons for error checking at the remote interrogation and receiver unit.

REMOTE INTERROGATION AND RECEIVER UNIT

The Remote Interrogation and Receiver Unit 110 located, typically, in a mobile unit 100, interrogates the monitor unit 20 to detect, decode and compare the radiation in the form of infrared pulses 226 beamed from monitor unit 20 in response to an interrogation transmission.

Figure 4:
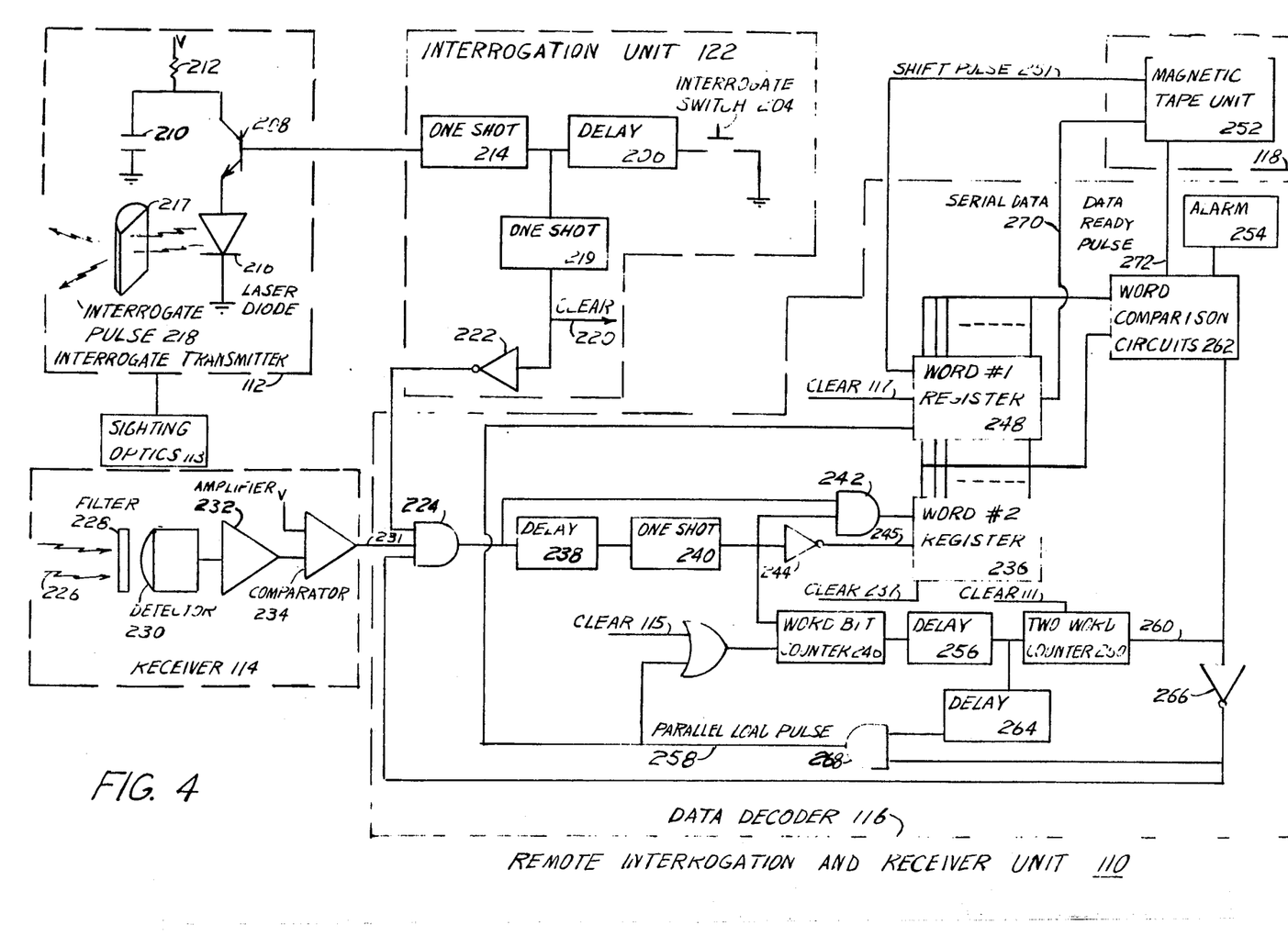
FIG. 4 is a more detailed block diagram of the remote interrogation and receiver unit.

The monitor unit 20 is activated when the transponder 40 detects an interrogation pulse 218 of infrared radiant energy from the interrogation transmitter 112 of the RIRU 110. Upon receipt of the interrogation pulse 218, the monitor unit 20 emits a coded pulse train 226 of infrared radiant energy which represents the above mentioned meter account number, quantity of utility consumed and meter status. As seen in FIG. 4, the receiver 114 of the RIRU 110 detects the infrared pulse train and converts the pulse train into electronic pulses that are subsequently decoded, checked for accuracy and stored in a means suitable for computer processing at a central location.

The RIRU 110 is adapted to operate either on an automatic or manual basis. The preferred mode will depend on various geometric and other considerations. The system thus provides the operator with a choice which he can select to satisfy prevailing conditions.

In the automatic mode a continuous interrogation pulse train 218 is emitted at a rate of about 1000Hz triggered by a clock, not shown, to sweep all possible, predetermined locations of the monitor units 20. This mode therefore provides automatic interrogation of all monitor units in a given area resulting in the required data reception with no operator intervention. The interrogation pulses 218 are generated in a manner described below in conjunction with the manual mode of operation.

In the manual mode the mobile unit 100 operator visually locates the monitor unit 20 by means of direct visual sighting or by the use of conventional sighting optics 113. The operator is then in a position to establish laser radiation communication between the RIRU 110 and the monitor unit 20, by activating the interrogation switch 204.

Switch 204, located in interrogation unit 122, initiates a delay multivibrator 206 whose delay time is of such duration as to ensure that only one interrogation pulse is generated when the interrogation switch 204 is activated. At the termination of the delay cycle of delay multivibrator 206 the interrogation transmitter 112 is activated.

The interrogation transmitter 112 comprises conventional laser diode driver circuits 208, 210, 212 and laser diode 216. Although there are numerous ways to construct a laser diode driver circuit, a simplified method is shown in FIG. 4. When transistor 208 is not conducting, capacitor 210 charges to a voltage V, through resistor 212.

After the delay provided by multivibrator 206, (see interrogation unit 122) the one shot multivibrator 214 turns on transistor 208, for a few hundred nanoseconds. While transistor 208 conducts, capacitor 210 discharges through a laser diode 216. The laser diode 216 generates an infrared interrogation pulse exemplified by arrow 218 and continues to do so as long as transistor 208 conducts. Capacitor 210 is of such a value that the RC time constant defined by the capacitor and the resistance of the conducting laser diode 216 is much greater than the duration of the one shot multivibrator 214 output.

The beam 218 of radiant energy from laser diode 216 is emitted through an optical lens 217 to form a beam 218 of rectangular cross-section to provide horizontal divergence on the order of a few degrees and a vertical divergence on the order of about 20°. The foregoing beam configuration is of exemplary nature and based upon interrogation of a monitor unit 20 located, hypothetically, at a horizontal distance of 100 feet and a vertical elevation from about zero to 40 feet. It should be obvious that depending upon the specific geometric requirements for a given application that the beam 218 configuration can be shaped by conventional optics to obtain the desired beam cross-section. For certain applications, the desired beam pattern may be inherent in the natural divergence of the laser diode output requiring no additional optics.

All registers and counters of data decoder 116 must be cleared before processing "new" data from the monitor unit 20. Upon termination of the delay provided by multivibrator 206, the one shot multivibrator 219 outputs a leading edge 220 that clears all registers and counters at their "clear" inputs 117, 237, 111 and 115. At the termination of the one shot multivibrator 219, an inverter 222 applies a logic "one" to "AND" gate 224 of decoder 116. Thus the "AND" gate 224 is disabled from passing data when the counters and registers are being cleared.

When the infrared synchronizer and data pulses 226 from the Monitor Unit 20 are received by the data receiver 114, they must be converted to an analog voltage, and then converted into digital logic voltages. Upon receipt of the interrogation pulse 218, see FIG. 4, from laser interrogate transmitter 112, the monitor unit 20 and, more particularly, laser data transmitter 36, transmits infrared synchronizer pulses and data pulses 226. These pulses pass through a narrow bandpass filter 228, forming part of data receiver 114, which passes approximately 100Å of the infrared spectrum centered at the transmit frequency. These pulses are sensed by the photodiode detector 230 which outputs corresponding analog voltage pulses. The detector 230 outputs each pulse to an amplifier 232 which amplifies the analog voltage and transmits the voltage to a comparator 234. The comparator 234 changes the voltage so as to be compatible with digital logic levels when the input voltage exceeds a predetermined threshold voltage. This digital logic level pulse 231 is of the same short duration as the input data and synchronizer voltages.

The incoming data and synchronizer pulses, see 226, are received in a serial pulse train with a synchronizer pulse received first, followed by one data bit. This synchronizer pulse data bit combination is repeated as long as pulses are received. The data bits may be binary "1" which is received as a pulse of infrared energy or a binary "0" which is an absence of infrared energy at the proper time, see FIG. 6. The synchronizer pulse is always received as a pulse of infrared energy.

The data bits are stored in the registers of word #2 register 236, of data decoder unit 116. The word #2 register 236 contains as many registers as there are data bits that form a complete word. The synchronizer pulse shifts the data bits into subsequent registers of word #2 register 236, until a complete word is contained therein.

The data is transmitted from the data receiver 114 to the word #2 register 236 by means of comparator 234 which sends a pulse 231 to the "AND" gate 224. With the inputs to the "AND" gate 224 enabled, the pulses from the comparator 234 pass through the "AND" gate 224 and initiate the delay multivibrator 238. The function of the delay multivibrator 238 is to ensure that a synchronizer pulse is not stored in the word #2 register 236, as a data pulse.

After the delay provided by multivibrator 238, one shot multivibrator 240 is initiated. The one shot multivibrator 240 enables the "AND" gate 242 for the time, approximately 8.0 milliseconds in the preferred embodiment, when a data bit is expected to be received, see FIG. 6. When received, the data bit, either a binary "1" or "0", passes through the "AND" gate 242 and is stored in the first register of word #2 register 236. In this manner data bits are extracted from the bit stream containing both data bits and synchronizer bits. At the termination of the operation of one shot multivibrator 240, an inverter 244 outputs a shift command pulse 245 to word #2 register 236. The data bit in the first register is then shifted to the next register of word #2 register 236. This data storing and shifting continues until one complete word from the monitor unit 20 is stored in register 236.

Two successive words from the monitor unit 20 are needed to be compared for validity. A word bit counter 246 will determine when one word is received. This word will be shifted to a word #1 register 248 and another word will be accumulated in word #2 register 236 in the previously described manner. Another counter 250 indicates when two words have been received. Further input synchronizer and data pulses 226, which are received from monitor unit 20 and more specifically laser data transmitter 36, are then inhibited by causing one input of "AND" gate 224 to change to a logic "zero" level and the two words are identically compared. If there is a valid comparison, the word is stored on magnetic tape, see 252 of the data storage unit 118, for data processing. If there is an invalid comparison, an alarm device 254 will alert that another sequence is to be performed. A more detailed description of these operations follows.

The one shot multivibrator 240 outputs a leading edge corresponding to a synchronizer pulse which is counted by the word bit counter 246. When the count of the word bit counter equals the number of data bits corresponding to one full word, a delay multivibrator 256 is initiated. The duration of the delay multivibrator 256 action is approximately 8 milliseconds and allows the last data bit of the word to be stored in word #2 register 236. At the termination of the delay provided by multivibrator 256, the contents of word #2 register 236 is loaded in parallel into word #1 register 248, by a parallel load command pulse, see 258. The termination of the delay multivibrator 256 also increments the two word counter 250 to a count of "1" to indicate "1" word has been received. The termination of the delay multivibrator 256 also clears the word bit counter 246 to initialize it for the next word.

When the word bit counter 246 indicates a second word is stored, the delay multivibrator 256 is again initiated. Upon delay multivibrator termination, the two word counter 250 is incremented to a count of "2" to indicate the second complete word is stored in word #2 register 236. When a count of "2" is reached by the two word counter 250, an "enable compare" command pulse, see 260 is output to activate word comparison circuits 262. The parallel load command pulse 258 is disabled by the combination of the delay multivibrator 264 and inverter 266, inhibiting the "AND" gate 268. Furthermore, the output of inverter 266 inhibits the receipt of additional data by disabling the "AND" gate 224, which is the main gate or communication control link between data receiver 114 and data decoder 116.

With the first word in word #1 register 248, and the second word in word #2 register 236, each corresponding bit of the two registers is identically compared by word comparison circuits 262. The word comparison circuit 262 is further described with reference to FIG. 4a. Provided is a two input "exclusive NOR" gate, 301a, 301b to 301n for each corresponding bit pair 311a and 313a, 311b and 313b, etc. of the two words. The "exclusive NOR" function provides a logic "one" output only when the two inputs are identically equal. Thus all of the "exclusive NOR" gates output a logic "one" only when the two words identically compare. The outputs of each "exclusive NOR" gate are input to an "AND" gate 307. The output of the "AND" gate is a logic "one" only if all bit pair comparisons prove identical when the enable compare pulse 260 is present.

Figure 4A:
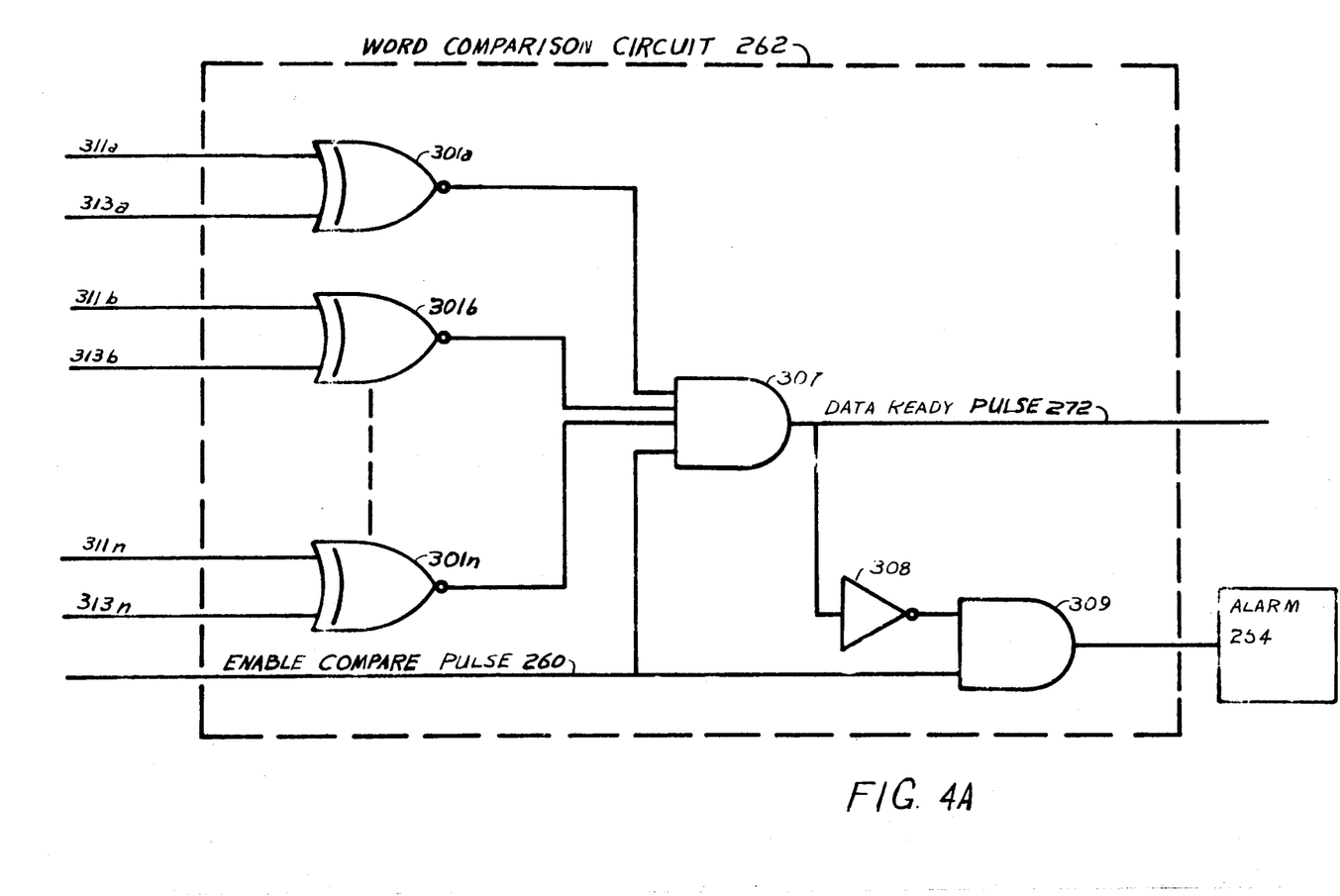
FIG. 4a is a block diagram illustrating the word comparison circuit of the remote interrogation and receiver unit.

If this equality occurs when the two word counter 250 outputs an enable command pulse 260, a data ready command pulse 272 as seen in FIG. 4 from the word comparison circuit 262 is output to the magnetic tape unit 252. The magnetic tape unit 252 will then output shift command pulses 251 to word #1 register 248 and serial data 270 will be stored on magnetic tape.

If a valid comparison does not occur when the enable compare command pulse 260 of FIG. 4a is generated, "AND" gate 307 outputs a logic "zero" which is inverted by inverter 308. Thus inverter 308 outputs an enable signal to "AND" gate 309 and in conjunction with the enable compare command pulse 260, "AND" gate 309 outputs a pulse to alarm 254. The audible or visual alarm 254 will initiate an alert so that another interrogation function can be performed.

All analog and digital circuitry and electro-optical devices described in this subsystem require direct current power derived from a power supply 320 which is located in the mobile unit 100 or hand transportable with RIRU 110. The direct current supplies the voltage levels required by and connects to the remote interrogation and receiver unit 110.

MULTIPLE MEMORY MONITOR UNIT

The monitor unit 20 readily lends itself to be adapted to structures where a plurality of utility meters are located closely together. The monitor units can be easily stacked as illustrated in FIG. 7, see multiple memory monitor unit 280, to facilitate the use of a single transponder 40 for interrogation reception and laser data transmission with no required change in the design of the digital storage and readout unit 30 shown in FIG. 3.

This method of combining a plurality of modular monitor units makes it possible thus to accomplish interrogation for transmission of data by a single pulse. The first digital storage and readout unit 30a in the stack is interrogated as previously described in FIG. 3. Subsequent digital storage and readout units are interrogated by sequential interrogation units 42 (a, b . . . n) after preceding digital storage and readout units have completed their data transmission cycle.

Figure 7:
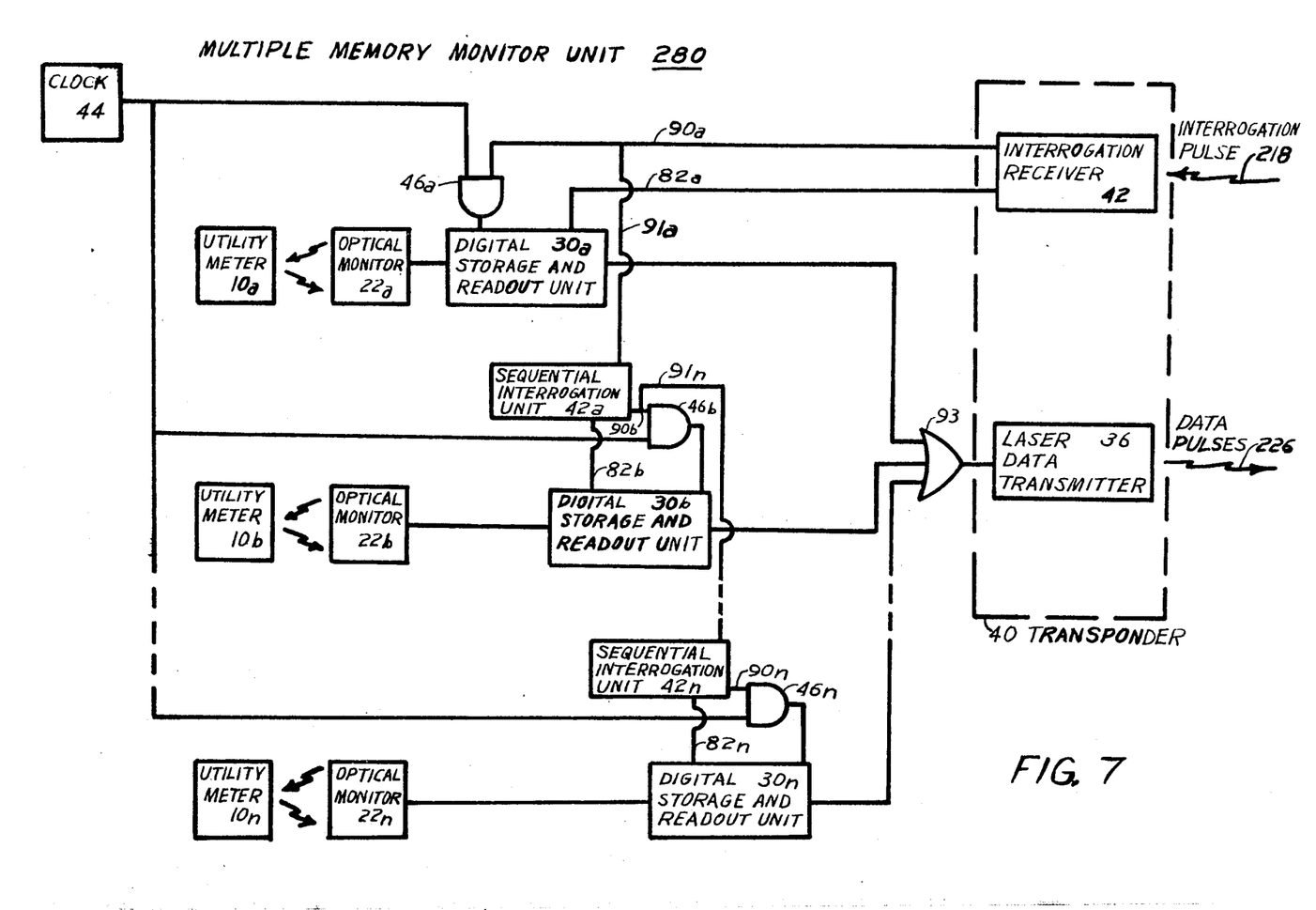
FIG. 7 is a block diagram illustrating a multiple memory monitor unit.

Referring now to FIG. 7, an optical monitor 22a, a digital storage and readout unit 30a and a readout activation "AND" gate 46a is required for each meter in the plurality of meters 10 n to be read. Laser interrogation radiation 218 from the RIRU 110 is detected by the interrogation receiver 42 as previously described. The receiver provides two control outputs 82a and 90a. A short duration digital pulse 82a prepares the first digital storage and readout unit 30a to serially output its digital word contents in the manner described above. A relatively long duration digital pulse 90a enables the first readout activation "AND" gate 46a and, therefore, establishes the period of time that the digital word stored in the digital storage and readout unit 30a is allowed to be cyclically output in serial form. The digital pulse 90a is also applied by cable 91a to the input of the sequential interrogation unit 42a. This unit inverts the input 91a to effect a delay equal to the period of time that the first memory 30a is allowed to transmit its contents. Upon termination of the delay, the sequential interrogation unit 42a outputs two control signals 82b and 90b which control the operation of the second digital storage and readout unit, 30b. Control signal 82b prepares the second memory 30b to serially output its digital word contents in an identical manner described for the first memory. Control signal 90b of identical duration as 90a enables a second readout activation "AND" gate 46b and, therefore, controls the period of time the second digital storage and readout unit 30b is allowed to cyclically output its digital word in serial form as previously described. This sequential process is identically repeated until all the stacked digital storage and readout units are interrogated.

In this manner each digital word corresponding to each meter in a common location is transmitted a multiplicity of times in sequential order. A digital "OR" gate 93 is used to allow serial outputs of any of the stacked digital storage and readout units to activate the single laser data transmitter 36 of the transponder 40. Consequently, the laser data transmitter 36 outputs a train of laser radiation pulses 226 containing synchronizer pulses and data pulses regarding the meter count, meter status and account index numbers for each of a plurality of meters which are grouped in a common location.

While laser diodes are preferred for most applications, it is possible to substitute other sources for generating light radiation, such as for instance, other types of lasers and light emitting diodes (LED). Such LED's however do not provide the degree of flexibility, with respect to power output, beam control, spectral line width, etc., that is inherent in laser diodes. Furthermore, laser diodes provide a very low cost, compact, rugged and dependable source of laser radiation.

While there have been described what are at present considered to be the preferred embodiments of this invention, it will be obvious to those skilled in the art that various changes and modifications may be made therein without departing from the invention, and it is aimed, therefore, in the appended claims to cover all such changes and modifications as fall within the true spirit and scope of the invention.

What is claimed is:

1. An electro-optical remote utility meter reading system comprising:
   first means generating a plurality of signals with each signal representing a predetermined quantity of the utility measured and with the number of signals generated being quantitatively in direct proportion to the utility measured by the meter;
   second means associated with said first means and being adapted to convert said signals into digital pulses;
   third means having a memory receiving and storing said digital pulses;
   fourth means comprising an electro-optical transponder effective in response to interrogation by laser radiation pulses to cause said third means to transfer pulses from said third means to said fourth means, and to emit said pulses in the form of laser radiation;
   fifth means comprising an interrogator at a location remote from said transponder to trigger said interrogation and to receive said pulses from said transponder;
   sixth means receiving signals from said interrogator for selectively providing intelligence reflecting the measured quantities.

2. A system according to claim 1, wherein said first means is an electro-optical device for generating said plurality of signals.

3. A system according to claim 1, wherein said electro-optical device is a meter scanner comprising a light emitting diode and a matching photodiode detector cooperating to measure said quantity.

4. A system according to claim 3, wherein said photodiode yields a single analog pulse in response to periodic illumination by said light emitting diode.

5. A system according to claim 4, and a filter associated with said detector, with said filter haviang a bandwidth substantially matching the output spectrum of said emitting diode and effective to block ambient light radiaion.

6. A system according to claim 1, wherein said first means generates an analog pulse and said second means includes a comparator converting said analog pulse into a digital pulse when the analog pulse level therein exceeds a predetermined threshold value.

7. A system according to claim 1, wherein said third means includes a digital storage and readout unit.

8. A system according to claim 7, wherein said last mentioned unit includes a multiple part memory register for storing data.

9. A system according to claim 8, wherein said memory has a set/readout means connectible for direct reading or testing.

10. A system according to claim 8, wherein said memory register includes meter reading count means, meter status indicator means and identifying means.

11. A system according to claim 1, wherein the transponder of the fourth means is effective to detect an interrogation signal of coherent laser radiation in the infrared spectrum.

12. A system according to claim 11, wherein said transponder includes an interrogate receiver having a second photodiode detector and a filter associated therewith of predetermined bandwidth.

13. A system according to claim 12, wherein said last mentioned bandwidth provides high attenuation to ambient radiation at wavelengths other than laser wavelength.

14. A system according to claim 12, and an amplifier connected to said second detector providing an analog pulse in response to interrogation from said fifth means.

15. A system according to claim 14, wherein said fourth means includes a comparator receiving analog pulses from said amplifier and when these pulses exceed a predetermined threshold level said comparator generates corresponding digital pulses.

16. A system according to claim 15, and a one shot multivibrator connected to said last mentioned comparator and effective to generate a logic "one" voltage level pulse.

17. A system according to claim 16, wherein the digital output of said fourth means comparator is effective to generate a load command to said memory of said third means.

18. A system according to claim 16, and control means including a digital inverter means connected to said multivibrator to control the sequence and duration of the signals to be transmitted through the transponder.

19. A system according to claim 16, and control means including a laser diode driver circuit forming part of said transponder.

20. A system according to claim 19, wherein said transponder includes a laser diode transmitter effective to transmit synchronizer pulses and data pulses to said fifth means.

21. A system according to claim 1, wherein said fifth means comprises means to locate and cooperate to establish electro-optical communication between said transponder and said interrogator.

22. A system according to claim 21, wherein said optical means comprises sighting optics.

23. A system according to claim 21, wherein said interrogator includes an array of laser diodes and a driver circuit therefor to provide an infrared radiation pulse.

24. A system according to claim 23, wherein said last mentioned driver circuit includes means to provide a single pulse interrogation trigger.

25. A system according to claim 1, wherein said interrogator of said fifth means includes a data receiver having a photodiode detector and being associated with a filter of predetermined bandwidth and effective to attenuate ambient radiation outside of the laser spectrum.

26. A system according to claim 25, wherein the detector of said fifth means in response to infrared radiation received from said fourth means converts said radiation into analog pulses.

27. A system according to claim 26, an amplifier and comparator associated with the detector of said interrogator of said fifth means, with the amplifier analog pulses to said comparator and the latter converting said analog pulses into digital pulses when the analog pulses exceed a predetermined threshold level.

28. A system according to claim 1, wherein said sixth means receives pulses from said fifth means, said sixth means including a word register, data decoder and word counter linked together to process and store the digital data.

29. A system according to claim 1, in combination with a system having a plurality of meters located in close physical proximity;
one of said first, second and third means associated with each individual meter;
a single fourth means associated with said plurality of meters to effect sequential interrogation and data pulse radiation.

30. A system according to claim 1, wherein said memory of said third means is non-volatile.

31. An electro-optical remote utility meter reading system, in which the meter or status indicator has a mechanical representation, comprising:
a monitor unit effective to count increments of movements of the utility meter comprising electro-optical light radiation monitoring and digital storage means effective to electro-optically detect a change in the mechanical representation and to translate such change into electronic digital pulses and to store the digital pulses, said monitor unit further including electro-optical transponder means for receiving said digital pulses from said storage means, converting said digital pulses into light radiation, and transmitting said radiation essentially only through an uncontrolled ambient atmospheric medium, said radiation being a carrier for a train of pulses; and
remote electro-optical interrogator and receiver means located at a point spaced from the transponder of said monitor unit and effective to electro-optically trigger said transponder and to receive said train of pulses from said transponder.

32. A system according to claim 31, wherein said light radiation is coherent laser radiation.

33. A system according to claim 32, wherein said laser radiation is derived from laser diodes.

34. A system according to claim 31, in which said monitoring and digital storing means comprises a meter scanner which includes a matched light emitting diode means and a photodiode detector means placed in juxtaposition to said light emitting diode means and at a location in optical contact with said mechanical representation.

35. A system according to claim 34, wherein said meter includes a rotating wheel provided with an opening extending generally parallel to the axis of rotation of the wheel, said emitting diode means and said photodiode detector means being placed on opposite sides of said wheel for periodic registry with said opening and to cause the emitting diode to illuminate said detecting diode through said opening.

36. A system according to claim 34, wherein said meter includes a rotating wheel and a light reflecting portion on said wheel, said emitting means being effective to illuminate said reflecting portion and said photodiode means being effective to detect said illumination.

37. A system according to claim 34, wherein said photodiode detector means of said meter scanner generates an analog pulse.

38. A system according to claim 37, wherein said meter scanner includes a comparator effective to receive analog pulses from said detector and convert said pulses into digital pulses.

39. A system according to claim 34 and an optical filter associated with said photodiode detector means to match the output spectrum of said emitting diode means and to block ambient light radiation.

40. A system according to claim 31, wherein said interrogation and receiver means is mobile.

41. A system according to claim 31, wherein said light radiation is non-coherent.

42. A system according to claim 31, wherein said monitoring and digital storage means continuously monitors and continuously translates each change into digital pulses.

43. An electro-optical remote utility meter reading system comprising:
utility meter monitoring means comprising a transponder responsive to light radiation and upon interrogation thereof transmitting data in the form of light radiation pulses; and
a mobile interrogation and receiver means located remote from said transponder and comprising an interrogator to trigger electrooptically with light radiation said interrogation and receive said data, and wherein said last mentioned light radiation has a beam of predetermined shape and diverging geometry, and said data is passed essentially only through an uncontrolled ambient atmospheric medium.

44. A system according to claim 43, wherein said light radiation is coherent laser radiation.

45. A system according to claim 44, wherein said laser radiation is derived from laser diodes.

46. A system according to claim 44, wherein said laser radiation between the transponder device and the interrogator device is coherent and the receiving element of each said device includes a filter having a bandwidth effective to block ambient light radiation and to pass the laser radiation.

47. A system according to claim 43, wherein said interrogation is a single pulse.

48. A system according to claim 43, wherein said interrogator includes an array of coupled laser diodes.

49. A system according to claim 43, wherein the light radiation pulses of said transponder and said interrogator provide beam patterns that differ with respect to each other in angularity of divergence and cross sectional shape.

50. A system according to claim 49, wherein the beam pattern of the interrogator has a substantially rectangular cross-section.

51. A system according to claim 49, wherein the beam pattern of the transponder is generally conically shaped.

* * * * *